(12) United States Patent
Kawaguchi et al.

(10) Patent No.: US 7,616,675 B2
(45) Date of Patent: Nov. 10, 2009

(54) SEMICONDUCTOR LASER DEVICE AND MANUFACTURING METHOD OF THE SAME

(75) Inventors: Kenichi Kawaguchi, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/902,622

(22) Filed: Sep. 24, 2007

(65) Prior Publication Data
US 2008/0080573 A1    Apr. 3, 2008

(30) Foreign Application Priority Data
Sep. 28, 2006    (JP) .............................. 2006-263690

(51) Int. Cl.
*H01S 5/00* (2006.01)
(52) U.S. Cl. .............................. 372/50.124; 372/43.01
(58) Field of Classification Search .............. 372/43.01, 372/50.124
See application file for complete search history.

(56) References Cited

U.S. PATENT DOCUMENTS

| | | | | |
|---|---|---|---|---|
| 4,608,696 A | * | 8/1986 | Law et al. ................... | 372/50.1 |
| 5,068,868 A | * | 11/1991 | Deppe et al. ............... | 372/45.01 |
| 5,577,064 A | * | 11/1996 | Swirhun et al. ............. | 372/96 |
| 6,021,147 A | * | 2/2000 | Jiang et al. .............. | 372/50.124 |
| 6,121,068 A | * | 9/2000 | Ramdani et al. ............. | 438/39 |
| 6,185,240 B1 | * | 2/2001 | Jiang et al. ............. | 372/50.124 |
| 6,246,708 B1 | * | 6/2001 | Thornton et al. ........ | 372/50.124 |
| 6,266,357 B1 | * | 7/2001 | Feld et al. ................. | 372/46.01 |
| 6,594,296 B1 | * | 7/2003 | Kaneko .................... | 372/46.01 |
| 7,433,380 B2 | * | 10/2008 | Takayama et al. ....... | 372/50.122 |
| 2003/0031218 A1 | * | 2/2003 | Yeh .............................. | 372/45 |
| 2004/0062945 A1 | * | 4/2004 | Domash et al. ............. | 428/641 |
| 2004/0264531 A1 | * | 12/2004 | Ryou et al. .................... | 372/45 |

FOREIGN PATENT DOCUMENTS

JP          10-256656          9/1998
WO     WO 2006/085361 A1     8/2006

* cited by examiner

Primary Examiner—Minsun Harvey
Assistant Examiner—Phillip Nguyen
(74) Attorney, Agent, or Firm—Kratz, Quintos & Hanson, LLP

(57) ABSTRACT

Disclosed is a semiconductor laser device capable of realizing efficient current injection and a method of manufacturing the same. The method includes the steps of: forming a DBR mirror over a Si substrate; forming an n-type conductive layer over the DBR mirror; forming a luminescent layer over a part of the n-type conductive layer; forming an insulating layer over a side surface of the luminescent layer over the n-type conductive layer; forming a p-type conductive layer over the insulating layer and the luminescent layer; forming another DBR mirror over the p-type conductive layer so as to be located immediately above the luminescent layer; forming an electrode electrically connected to the n-type conductive layer; and forming another electrode over the p-type conductive layer.

17 Claims, 11 Drawing Sheets

SEMICONDUCTOR LASER DEVICE AND MANUFACTURING METHOD OF THE SAME

CROSS-REFERENCE TO RELATED APPLICATIONS

This application is based upon and claims the benefits of priority from the prior Japanese Patent Application No. 2006-263690, filed on Sep. 28, 2006, the entire contents of which are incorporated herein by reference.

BACKGROUND OF THE INVENTION

1. Field of the Invention

The present invention relates to a semiconductor laser device and a method of manufacturing the same. More particularly, the present invention relates to a surface-emitting semiconductor laser device and a method of manufacturing the same.

2. Description of the Related Art

Recently, development of a surface-emitting laser array (also referred to as a VCSEL (Vertical Cavity Surface Emitting Laser) array) applicable to optical wiring between chips or boards and monolithically formed over a Si substrate has been proceeding.

For Si based Vertical-cavity light emitting devices, there is proposed a structure in which a silicon dioxide ($SiO_2$) layer containing fine silicon germanium (SiGe) grains is used as a luminescent layer and the upper and lower sides of the luminescent layer are sandwiched between DBR (Distributed Bragg Reflector) mirrors composed of a multilayer film including a plurality of Si layers and $SiO_2$ layers (see, e.g., K. Toshikiyo, et al., "Enhanced optical properties of $Si_{1-x}Ge_x$ alloy nanocrystals in a planar microcavity", J. Appl. Phys. 93, 2178 (2003)).

In a semiconductor laser device, a current (threshold current) for producing laser oscillation must be injected into a luminescent layer.

However, when a $SiO_2$ film as an insulating film is used for the DBR mirror, it is impossible to form electrodes over top surfaces of the DBR mirrors sandwiching the luminescent layer and inject a current into the luminescent layer through the DBR mirrors. Therefore, an area of the luminescent layer is sufficiently made larger than that of the DBR mirror (cavity area) and an upper electrode is formed over a space of the top surface of the luminescent layer (see, e.g., Japanese Unexamined Patent Application Publication No. 10-256656 (paragraph number [0029] and FIG. 1)).

However, when the luminescent layer area is increased, a current per unit area (current density) injected into the luminescent layer is reduced and as a result, the laser oscillation cannot be created.

To increase the luminescent layer area to form an electrode structure on the layer, the luminescent layer area must generally be increased to be about 100 times as large as the cavity area. For example, assuming that a cavity diameter is 3 µm and an electrode width is 30 µm, the luminescent layer area required is at least 121 times as large as the cavity area.

Further, when the luminescent layer area is increased, a current flows concentratedly in a portion where an electrode is formed and as a result, in-plane dependency occurs in a luminescent portion in the luminescent layer as well as displacement may occur between a most light emitting portion and a portion where the cavity is formed.

SUMMARY OF THE INVENTION

According to one aspect of the present invention, there is provided a surface light emitting semiconductor laser device. This semiconductor laser device includes: a semiconductor substrate; a first reflective layer composed of a multilayer film formed over the semiconductor substrate; a first conductive layer of a first conductivity-type formed over the first reflective layer; a luminescent layer formed over a part of the first conductive layer; an insulating layer formed over a side surface of the luminescent layer over the first conductive layer; a second conductive layer of a second conductivity-type formed over the insulating layer and the luminescent layer; a second reflective layer composed of a multilayer film formed over the second conductive layer so as to be located immediately above the luminescent layer; a first electrode electrically connected to the first conductive layer; and a second electrode formed over the second conductive layer.

According to another aspect of the present invention, there is provided a method of manufacturing a surface-emitting semiconductor laser device. This manufacturing method includes the steps of: forming a first reflective layer composed of a multilayer film over a semiconductor substrate; forming a first conductive layer of a first conductivity-type over the first reflective layer; forming a luminescent layer over a part of the first conductive layer; forming an insulating layer over a side surface of the luminescent layer over the first conductive layer; forming a second conductive layer of a second conductivity-type over the insulating layer and the luminescent layer; forming a second reflective layer composed of a multilayer film over the second conductive layer so as to be located immediately above the luminescent layer; forming a first electrode electrically connected to the first conductive layer; and forming a second electrode over the second conductive layer.

DESCRIPTION OF THE PREFERRED EMBODIMENTS

Figure 1:
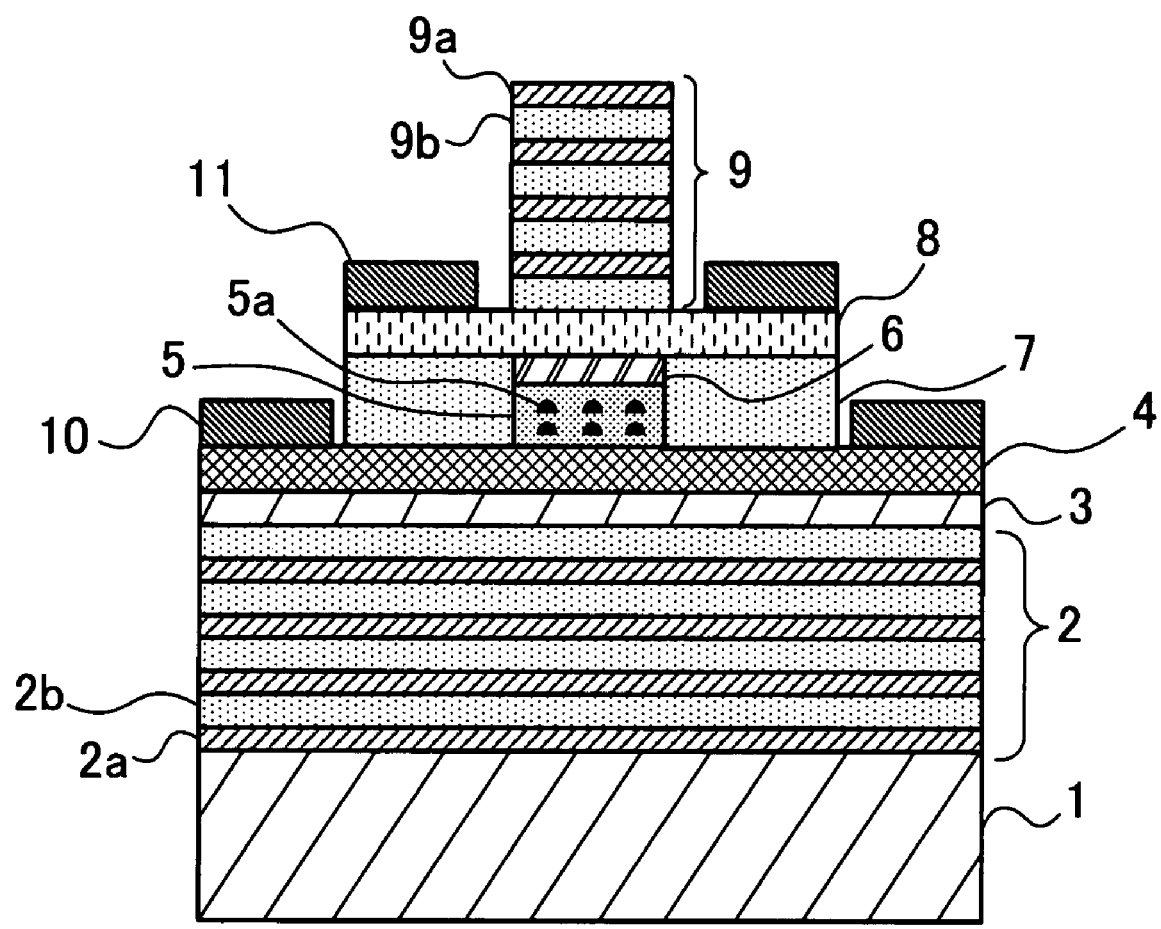
FIG. 1 is a cross sectional view showing a structure of a semiconductor laser device according to a first embodiment.

Preferred embodiments of the present invention will be described in detail below with reference to the accompanying drawings, wherein like reference numerals refer to like elements throughout.

FIG. 1 is a cross sectional view showing a structure of a semiconductor laser device according to a first embodiment.

Figure 2:
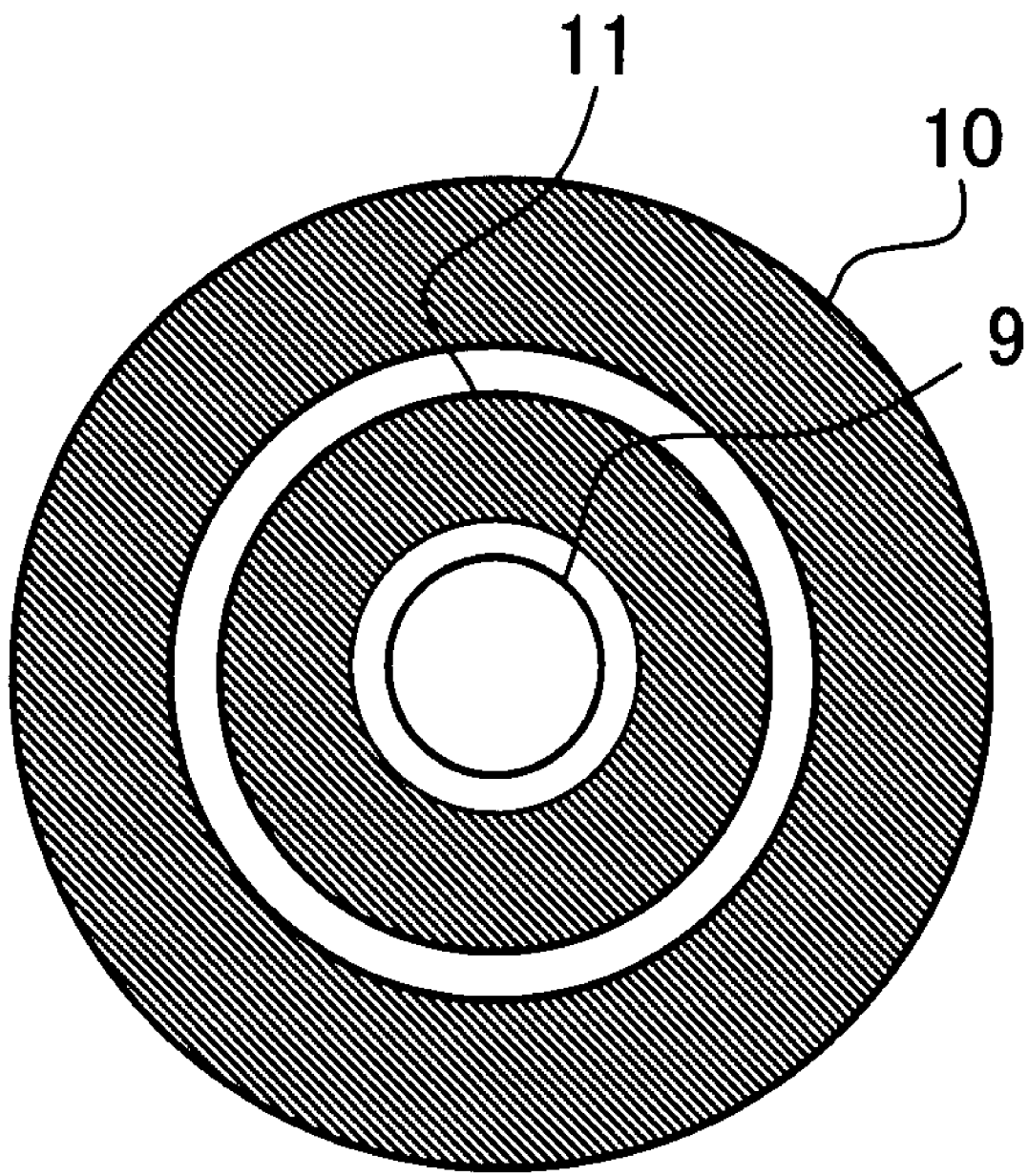
FIG. 2 is a top view of the semiconductor laser device according to the first embodiment.

FIG. 2 is a top view of the semiconductor laser device according to the first embodiment.

The semiconductor laser device according to the first embodiment is a surface-emitting laser. Specifically, the laser device has a Si substrate 1, a DBR mirror 2 composed of a multilayer film formed over the Si substrate 1, a single crystal Si layer 3 formed over the DBR mirror 2 and an n-type conductive layer 4 formed over the single crystal Si layer 3. The device further has a luminescent layer 5 formed over a part of the conductive layer 4, a p-type conductive layer 6 formed over the luminescent layer 5, an insulating layer 7 formed over a side surface of the luminescent layer 5, a p-type conductive layer 8 formed over the insulating layer 7 and the luminescent layer 5 (through a conductive layer 6 in the figure), and a DBR mirror 9 composed of a multilayer film formed over the conductive layer 8 so as to be located immediately above the luminescent layer 5. For electrodes for injecting a current into the luminescent layer 5, an electrode 10 and an electrode 11 are further formed over the conductive layer 4 and the conductive layer 8, respectively.

The DBR mirrors 2 and 9 have a structure in which two layers having different refractive indexes, for example, Si layers 2a and 9a and SiO$_2$ layers 2b and 9b are alternately laminated in plural layers, respectively.

The conductive layer 4 is formed over the single crystal Si layer 3 by crystal growth and has a single crystal structure doped with n-type impurities. The reason is that over the conductive layer 4, the luminescent layer 5 made of Si raw materials is formed by single crystal growth. The p-type conductive layer 6 over the luminescent layer 5 is also formed by crystal growth so as not to deteriorate the crystallinity of the luminescent layer 5 and has a single crystal structure.

The present inventor has invented a light emitting element having high luminous efficiency, in which a luminescent layer composed of a IV-group semiconductor mixed crystal silicon germanium carbon ($Si_{1-x-y}Ge_xC_y$ ($0<x\leq1$, $0\leq y\leq0.005$)) layer including quantum dots of direct transition type III-V compounds is used over a Si substrate (see, e.g., WO2006/085361).

Also in the semiconductor laser device of the present embodiment, when these materials are used, the surface-emitting laser having high luminous efficiency can be formed. For example, the luminescent layer 5 has a SiGeC layer including quantum dots 5a of III-V compounds such as indium arsenic antimony (InAsSb). In response to this, the SiGeC layer doped with n-type or p-type impurities is used also for the single-crystal conductive layers 4 and 6.

In the semiconductor laser device according to the first embodiment, the insulating layer 7 formed over the side surface of the luminescent layer 5 is formed to have a smaller area than a top surface area of the conductive layer 4. The reason is that, for example, the ring-shaped electrode 10 is disposed over the conductive layer 4. The insulating layer 7 may be formed to completely surround the side surface of the luminescent layer 5.

The conductive layer 8 is electrically connected to the luminescent layer 5 through the conductive layer 6. The conductive layer 8, since being formed also over the insulating layer 7, is formed to have a larger area than the top surface area of the luminescent layer 5. Over the conductive layer 8, the DBR mirror 9 having a cavity area approximately equal to that of the luminescent layer 5 is formed to be located immediately above the luminescent layer 5. Further, for example, the ring-shaped electrode 11 is formed over the conductive layer 8 to surround the DBR mirror 9 as shown in FIG. 2. For the conductive layer 8, for example, a p-type polycrystalline Si layer or p-type polycrystalline Si compound layer is used.

By forming the semiconductor laser device to have the above-described structure, a current can be injected into the luminescent layer 5 from the electrode 11 formed over the conductive layer 8, with no need to increase the area of the luminescent layer 5 itself. In other words, the top surface area of the luminescent layer 5 can be made approximately equal to the cavity area and therefore, efficient current injection is enabled so that laser oscillation can be realized with a low current.

Next, a method of manufacturing the semiconductor laser device according to the first embodiment will be described in detail.

FIGS. 3A and 3B to FIGS. 6A and 6B are cross sectional views in the respective manufacturing steps of the semiconductor laser device according to the first embodiment.

Figure 3A:
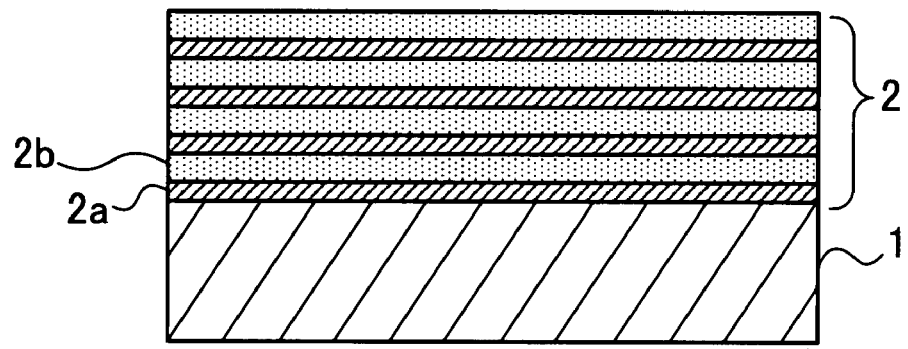
FIGS. 3A and 3B are cross sectional views in the respective manufacturing steps of the semiconductor laser device according to the first embodiment (part 1).

Over the Si substrate 1, the Si layer 2a and the SiO$_2$ layer 2b are first alternately laminated, for example, using CVD (Chemical Vapor Deposition) to form the DBR mirror 2 (FIG. 3A). In the case of the DBR mirror 2 having a simplest perfect periodic structure, a maximum reflectance of the DBR mirror 2 is obtained when a thickness of each pair of the Si layer 2a and the SiO$_2$ layer 2b is set to be equal to an integral multiple of a quarter wavelength that is a length converted into an optical distance. Further, the reflectance can be improved also by increasing the number of repetition of a pair of the Si layer 2a and the SiO$_2$ layer 2b (the periodicity of the DBR mirror).

For example, in the case where an oscillation wavelength is 1.3 µm, the reflectance of 99% or more required to realize an excellent VCSEL may be obtained by setting the thickness of the Si layer to 96 nm, the thickness of the SiO$_2$ layer to 225 nm and the periodicity of the DBR mirror to 4 or more.

Figure 3B:
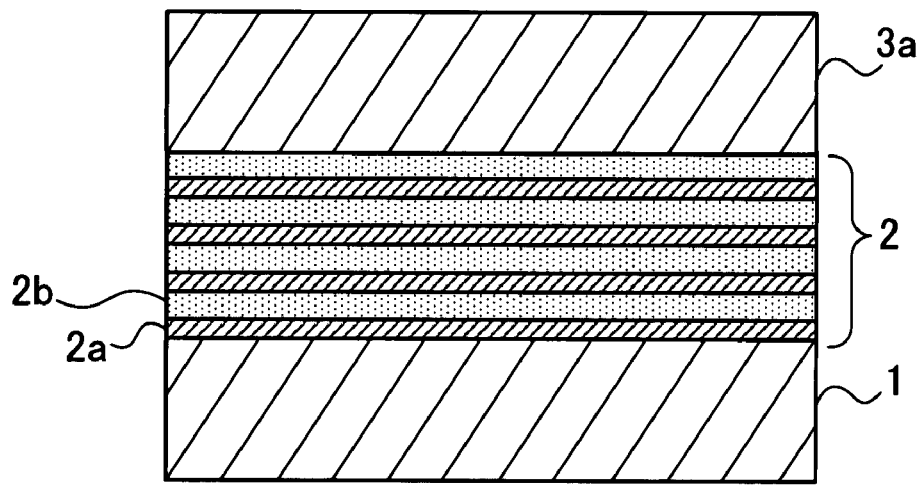
Figure 4A:
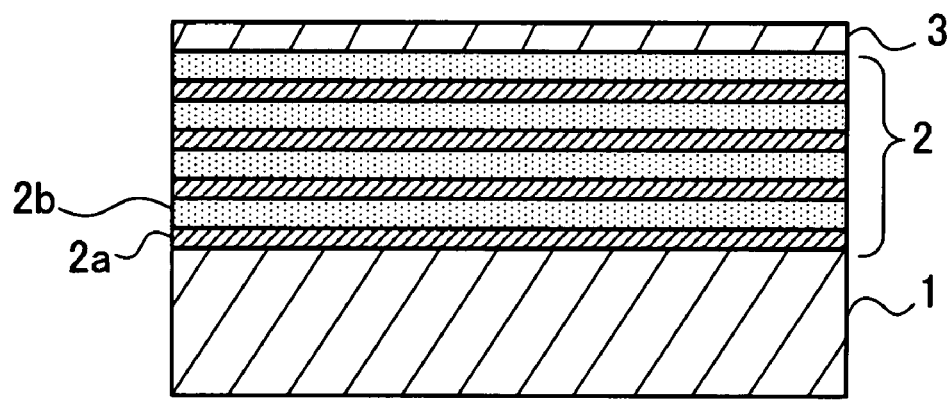
FIGS. 4A and 4B are cross sectional views in the respective manufacturing steps of the semiconductor laser device according to the first embodiment (part 2).

After the formation of the DBR mirror 2, a Si substrate 3a is bonded over the DBR mirror 2 by wafer bonding (FIG. 3B). The Si substrate 3a is diced and polished to form the single crystal Si layer 3 having, for example, a thickness of 100 nm (FIG. 4A).

Figure 4B:
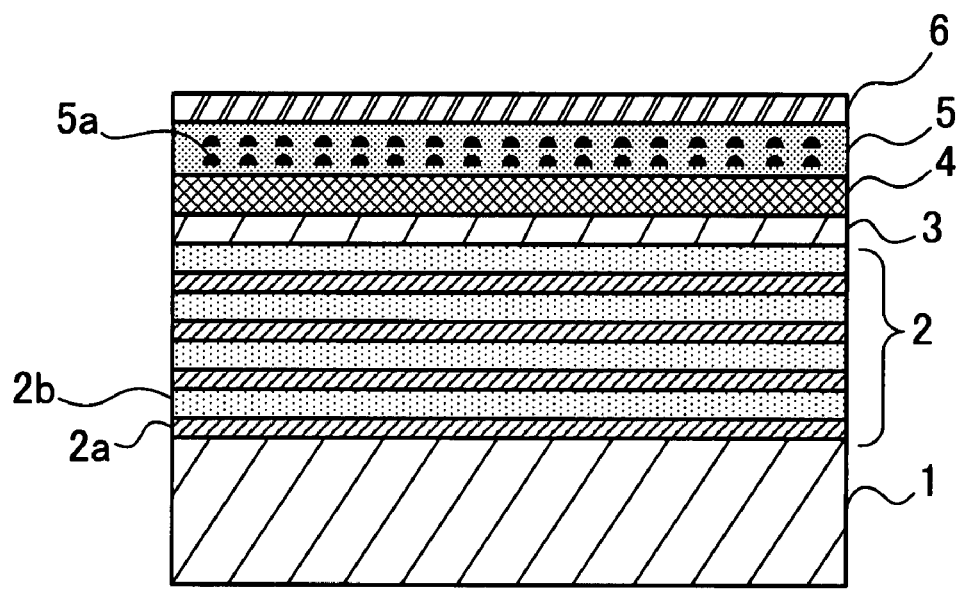

Thereafter, the n-type conductive layer 4, the luminescent layer 5 including quantum dots 5a and the p-type conductive layer 6 are formed over the single crystal Si layer 3 by crystal growth. The crystal growth is performed by Metal-Organic Vapor Phase Epitaxy (MOVPE) or molecular beam epitaxy (FIG. 4B).

For the conductive layer 4, an n-type SiGeC layer is grown, for example, at 650° C. As n-type impurities, arsenic (As) is implanted at a concentration of $1\times10^{18}$ cm$^{-3}$.

For the luminescent layer 5, an undoped SiGeC layer is grown to a thickness of 50 nm at a growth temperature of 650° C. Thereafter, InAsSb (III-V group) is grown as quantum dots 5a. The crystal growth of InAsSb is performed at a growth temperature of 500° C. by feeding In (III group) at a feed rate of 2 mL, and As and Sb (V group) at a feed rate corresponding to ten times as much as that of In (III group). Thereafter, a cap layer composed of SiGeC is grown to a thickness of 50 nm at a growth temperature of 500° C.

For the conductive layer 6, a p-type SiGeC layer is grown at a growth temperature of 650° C. As p-type impurities, for example, boron (B) is implanted at a concentration of $1 \times 10^{18}$ cm$^{-3}$.

For the growth of SiGeC using the MOVPE, for example, disilane ($Si_2H_6$), Germane ($GeH_4$) and monomethylsilane ($SiH_3CH_3$) may be used. For the growth of InAsSb, for example, trimethylindium (TMIn), arsine ($AsH_3$) and trimethylantimony (TMSb) may be used.

By thus forming the respective layers from the single crystal Si layer 3 to the conductive layer 6 by crystal growth, a high quality crystal structure can be obtained in the luminescent layer 5.

Figure 5A:
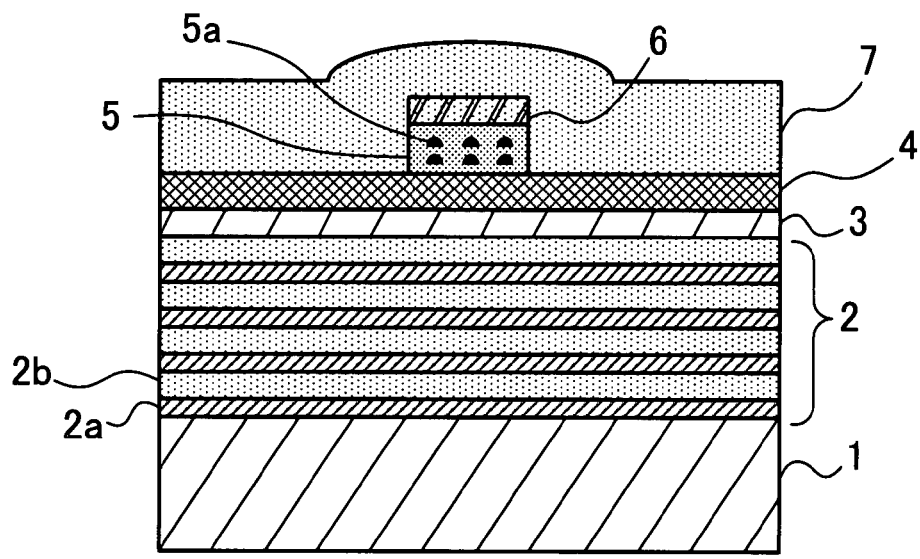
FIGS. 5A and 5B are cross sectional views in the respective manufacturing steps of the semiconductor laser device according to the first embodiment (part 3).

After growing the conductive layer 6, a mesa structure including the luminescent layer 5 and the conductive layer 6 is formed over a part of the conductive layer 4 by lithography and etching. Thereafter, the insulating layer 7 composed of $SiO_2$ is deposited, for example, by the CVD method (FIG. 5A).

Figure 5B:
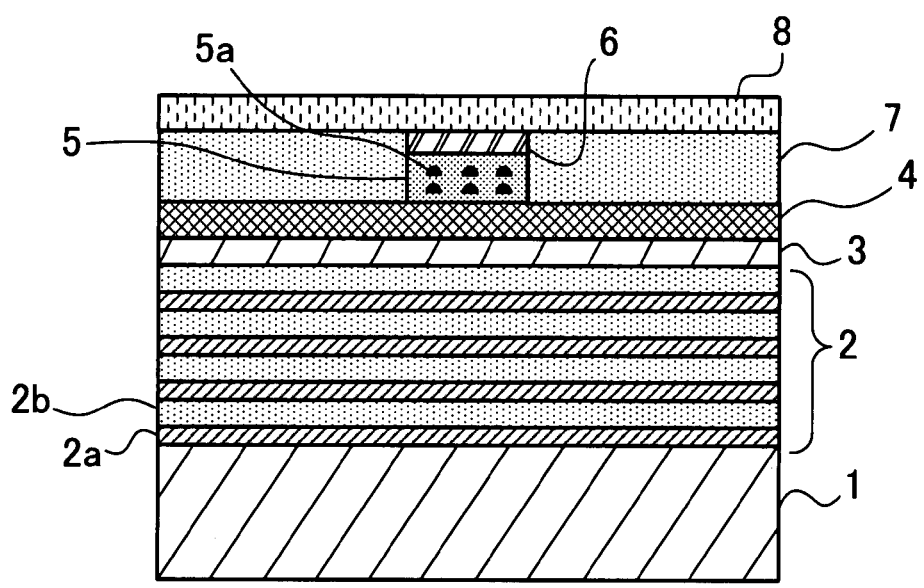

Thereafter, the insulating layer 7 is planarized by polishing to expose the conductive layer 6. Then, a p-type polycrystal Si is deposited over the insulating layer 7 and the exposed conductive layer 6 to form the conductive layer 8 (FIG. 5B). In this case, for example, the p-type impurity concentration may be set to $1 \times 10^{19}$ cm$^{-3}$ and the film thickness may be set to 100 nm (in order that the total thickness of the single crystal Si layer 3, the conductive layer 4, the luminescent layer 5, the conductive layer 6 and the conductive layer 8 is equal to an integral multiple of the half oscillation wavelength, the thickness of each layer is adjusted).

Figure 6A:
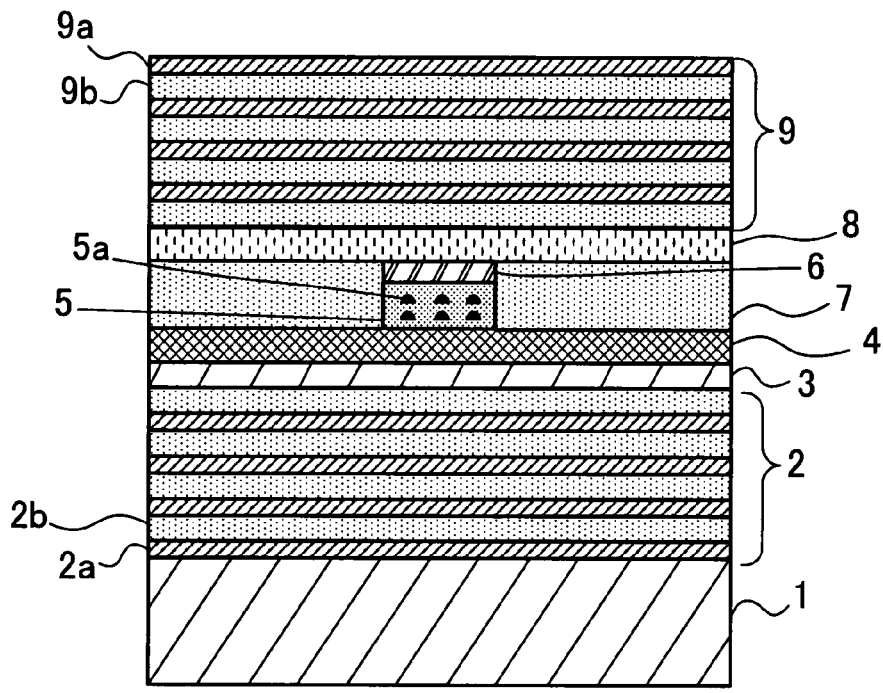
FIGS. 6A and 6B are cross sectional views in the respective manufacturing steps of the semiconductor laser device according to the first embodiment (part 4).
Figure 6B:
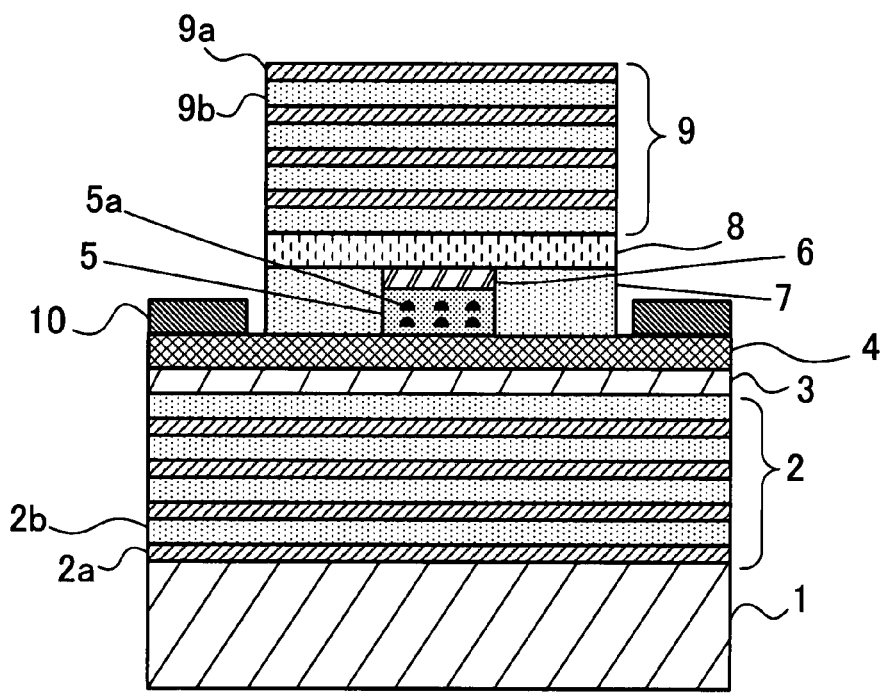

After forming the conductive layer 8, the Si layer 9a and the $SiO_2$ layer 9b are alternately laminated to form the DBR mirror 9 in the same manner as in the above-described DBR mirror 2 (FIG. 6A). Further, a lithography process is performed such that the conductive layer 8 has a larger area than the top surface area of the luminescent layer 5. Then, the DBR mirror 9, the conductive layer 8 and the insulating layer 7 are etched. As a result, since the conductive layer 4 is partially exposed, the electrode 10 is formed over the exposed conductive layer 4 (FIG. 6B). Further, the lithography and etching processes are performed such that an area of the DBR mirror 9 immediately above the luminescent layer 5 is made approximately equal to the top surface area of the luminescent layer 5, thereby completing the DBR mirror 9. Then, the electrode 11 is formed over the conductive layer 8 exposed by the above processes. Thus, the surface-emitting semiconductor laser device according to the first embodiment shown in FIG. 1 is formed.

The structures of the DBR mirrors 2 and 9 are not limited to the above-described film thickness and periodicity. Also the materials of the DBR mirrors 2 and 9 are not limited to Si and $SiO_2$, and the known material combinations can be used.

The DBR mirrors 2 and 9 need not necessarily be composed of the multilayer film using the same materials.

In the above description, there is exemplified a case of using $InAs_{1-x}Sb_x$ as materials of the quantum dots 5a but the present invention is not limited to this material. Other direct transition type compound semiconductors, for example, indium gallium antimony ($In_{1-x}Ga_xSb$), indium antimony nitride ($InSb_{1-x}N_x$) and indium arsenic nitride ($InAs_{1-x}N_x$) may also be used.

The conductive layer 8 may be formed by using a p-type Si compound, for example, iron silicide ($FeSi_2$) instead of polycrystal Si.

In the above description, the cavity area and the top surface area of the luminescent layer 5 are made approximately equal to each other. Further, the top surface area of the luminescent layer 5 may be made smaller than the cavity area.

In the above description, the conductivity-type of the conductive layer 4 is set to n-type, and the conductivity-type of each of the conductive layers 6 and 8 is set to p-type. Further, the conductivity-type may of course be reversed.

The electrodes 10 and 11 need not necessarily be ring-shaped. Further, there is no need to form the insulating layer 7 and the conductive layer 8 symmetrically around the cavity portion as shown in FIG. 1.

Figure 7:
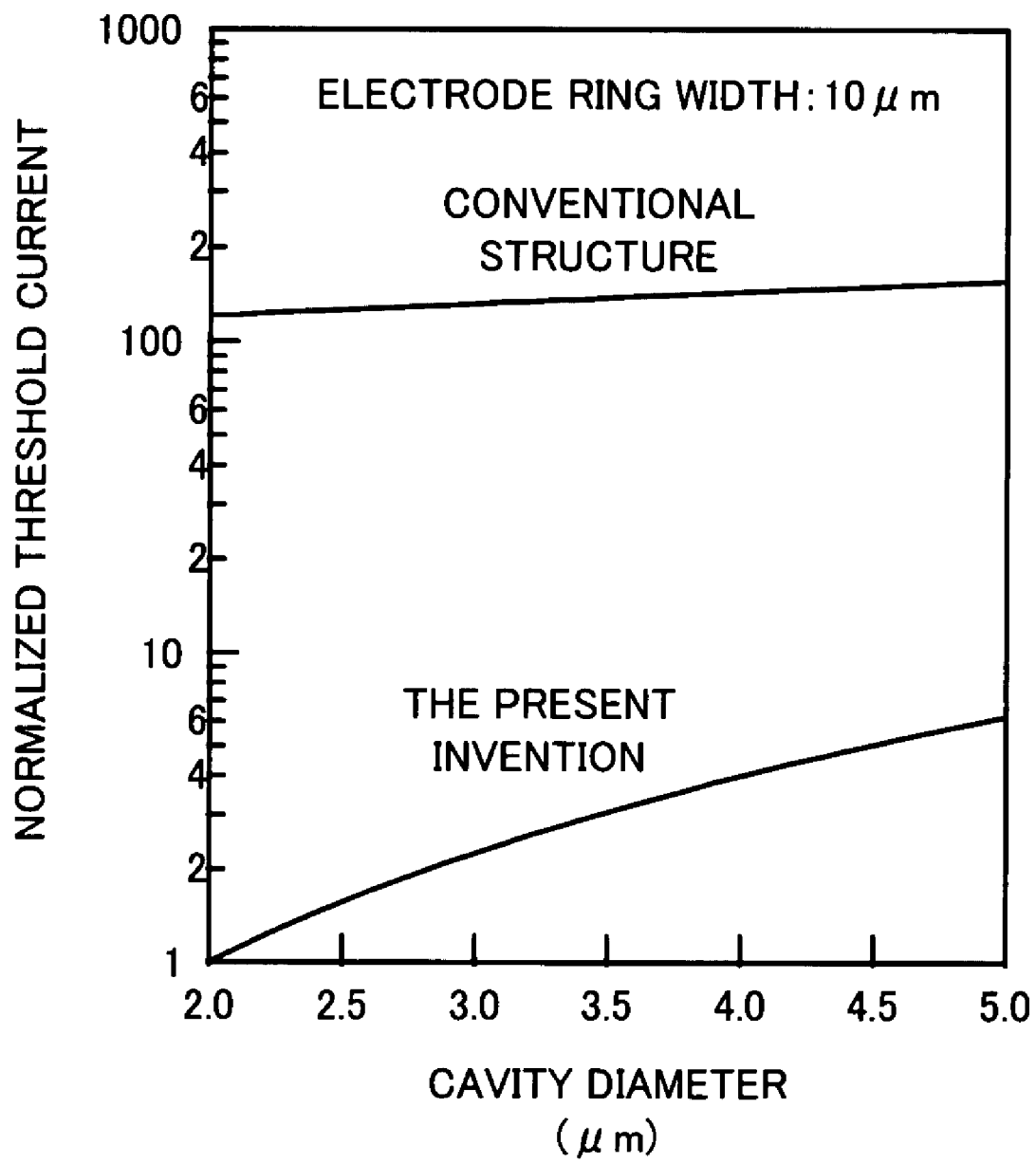
FIG. 7 shows a change of the threshold current versus the cavity diameter in the semiconductor laser device according to the present embodiment.

FIG. 7 shows changes of the threshold current versus the cavity diameter in the semiconductor laser device according to the present embodiment.

For comparison, FIG. 7 additionally shows changes of the threshold current versus the cavity diameter in the conventional structure in which the luminescent layer area is made larger than the cavity area to form the electrode over the luminescent layer area.

In FIG. 7, normalization is performed such that when the cavity diameter is 2 μm, the threshold current in the semiconductor laser device according to the present embodiment is 1. An electrode ring width is set to 10 μm.

In the semiconductor laser device according to the present embodiment, the area of the luminescent layer 5 can be made approximately equal to the cavity area. Therefore, as the cavity diameter is more reduced, the threshold current can be more reduced as shown in the figure. As compared with the conventional structure, for example, the threshold current can be reduced to 1/25 in the case where the cavity diameter is 5 μm, and further reduced to 1/121 in the case where the cavity diameter is 2 μm.

According to the semiconductor laser device of the present embodiment, by increasing the area of the conductive layer 8, the area of the electrode 11 can be increased independently of the area of the luminescent layer 5. Therefore, the electrode 11 with low resistance can be formed.

Further, the insulating layer 7 has a refractive index lower than that of the luminescent layer 5. Therefore, by surrounding the side surface of the luminescent layer 5 with the insulating layer 7, a light confinement structure can be formed. Further, by adjusting the area of the luminescent layer 5, transverse mode of light can be controlled independently of the DBR mirrors 2 and 9.

Next, a semiconductor laser device according to a second embodiment will be described.

Figure 8:
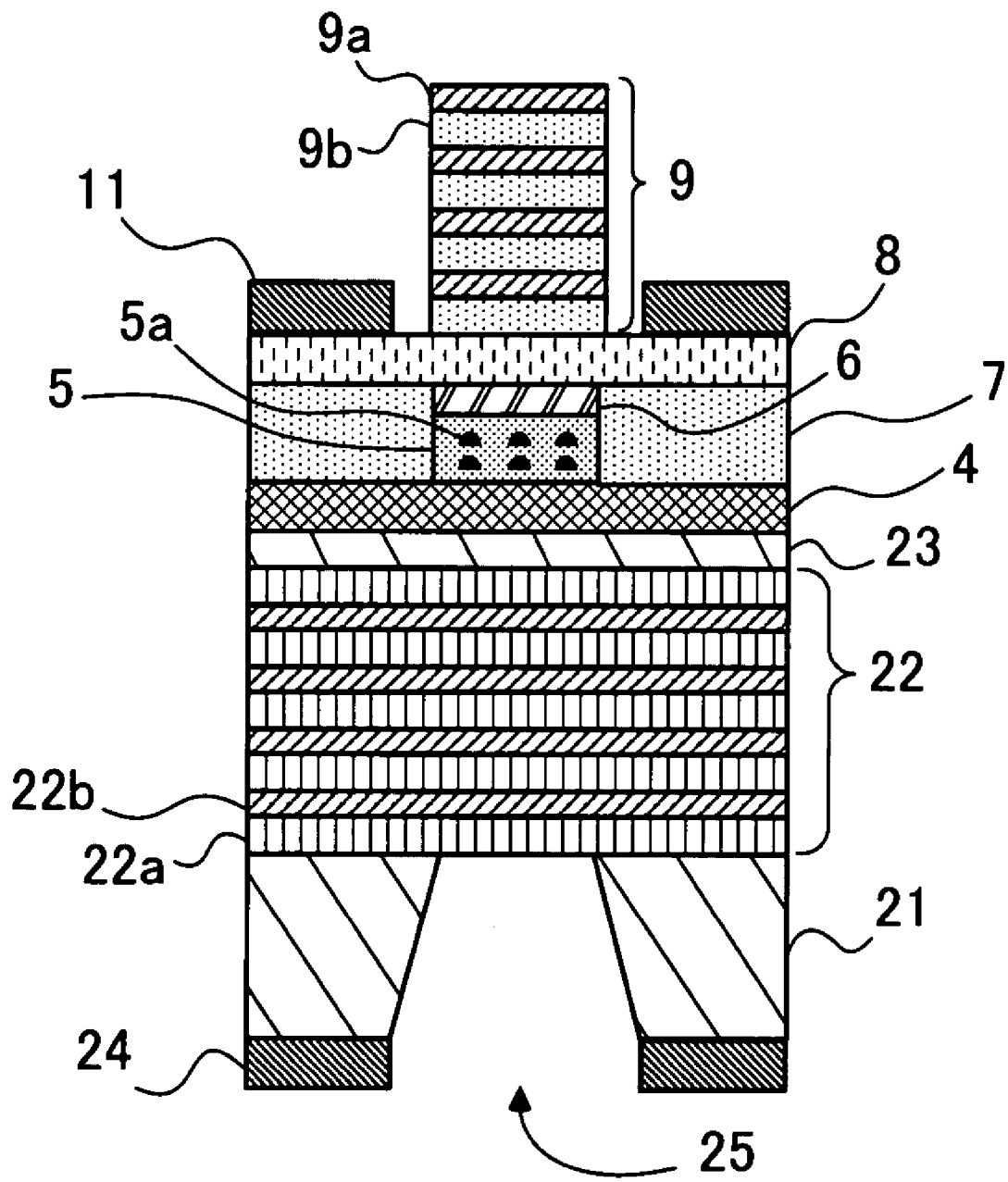
FIG. 8 is a cross sectional view showing a structure of a semiconductor laser device according to a second embodiment.

FIG. 8 is a cross sectional view showing a structure of the semiconductor laser device according to the second embodiment.

In FIG. 8, the same elements as those of the semiconductor laser device according to the first embodiment are indicated by the same reference numerals as those of the semiconductor laser device according to the first embodiment and the description is omitted.

The semiconductor laser device of the second embodiment differs from that of the first embodiment in the following points. That is, an n-type Si substrate 21 is used as the substrate and a DBR mirror 22 with electrical conductivity is formed over the substrate 21. The DBR mirror 22 is composed of a multilayer film including, for example, n-type SiGe layers 22a and n-type Si layers 22b.

For example, in the case where an oscillation wavelength is 1.3 μm, the reflectance of 90% or more may be obtained by setting the thickness of the SiGe layer 22a to 90 nm with a composition represented by $Si_{0.6}Ge_{0.3}$, the thickness of the Si layer 22b to 96 nm, and the periodicity of the DBR mirror to 30.

Over the DBR mirror 22, an n-type single crystal Si layer 23 is formed.

Over the n-type single crystal Si layer 23, the conductive layer 4 composed of n-type SiGeC is formed by crystal growth in the same manner as in the semiconductor laser device of the first embodiment. A structure over the conductive layer 4 is almost the same as that of the semiconductor laser device according to the first embodiment. However, since the DBR mirror 22 has electrical conductivity, an electrode 24 is formed not over the conductive layer 4 but over the bottom surface of the n-type Si substrate 21.

In the case of the semiconductor laser device according to the second embodiment, since the lower DBR mirror 22 is disposed on a transmission side, the Si substrate 21 has an opening 25 for extracting a laser beam. The opening 25 can be formed by forming the electrode 24 over the bottom surface of the Si substrate 21 and then simultaneously etching the electrode 24 and the Si substrate 21.

The single crystal Si layer 23 over the DBR mirror 22 can be formed also by wafer bonding in the same manner as in the method of manufacturing the semiconductor laser device according to the first embodiment. Further, the respective layers from the n-type Si substrate 21 to the conductive layer 6 can be epitaxially grown over the n-type Si substrate 21.

Also in the above-described semiconductor laser device according to the second embodiment, the same effect as that of the semiconductor laser device according to the first embodiment can be obtained. That is, a current can be injected into the luminescent layer 5 from the electrode 11 formed over the conductive layer 8, with no need to increase the area of the luminescent layer 5 itself. In other words, the top surface area of the luminescent layer 5 can be made approximately equal to the cavity area and therefore, efficient current injection is enabled so that laser oscillation can be realized with a low current.

In the case of the semiconductor laser device according to the second embodiment, the DBR mirror 22 has electrical conductivity and also the n-type single crystal Si layer 23 has electrical conductivity. Accordingly, the conductive layer 4 may be omitted.

In the above description, the conductivity-type of each of the Si substrate 21, the DBR mirror 22, the single crystal Si layer 23 and the conductive layer 4 is set to n-type, and the conductivity-type of each of the conductive layers 6 and 8 is set to p-type. Further, the conductivity-type may of course be reversed.

Next, a semiconductor laser device according to a third embodiment will be described.

Figure 9:
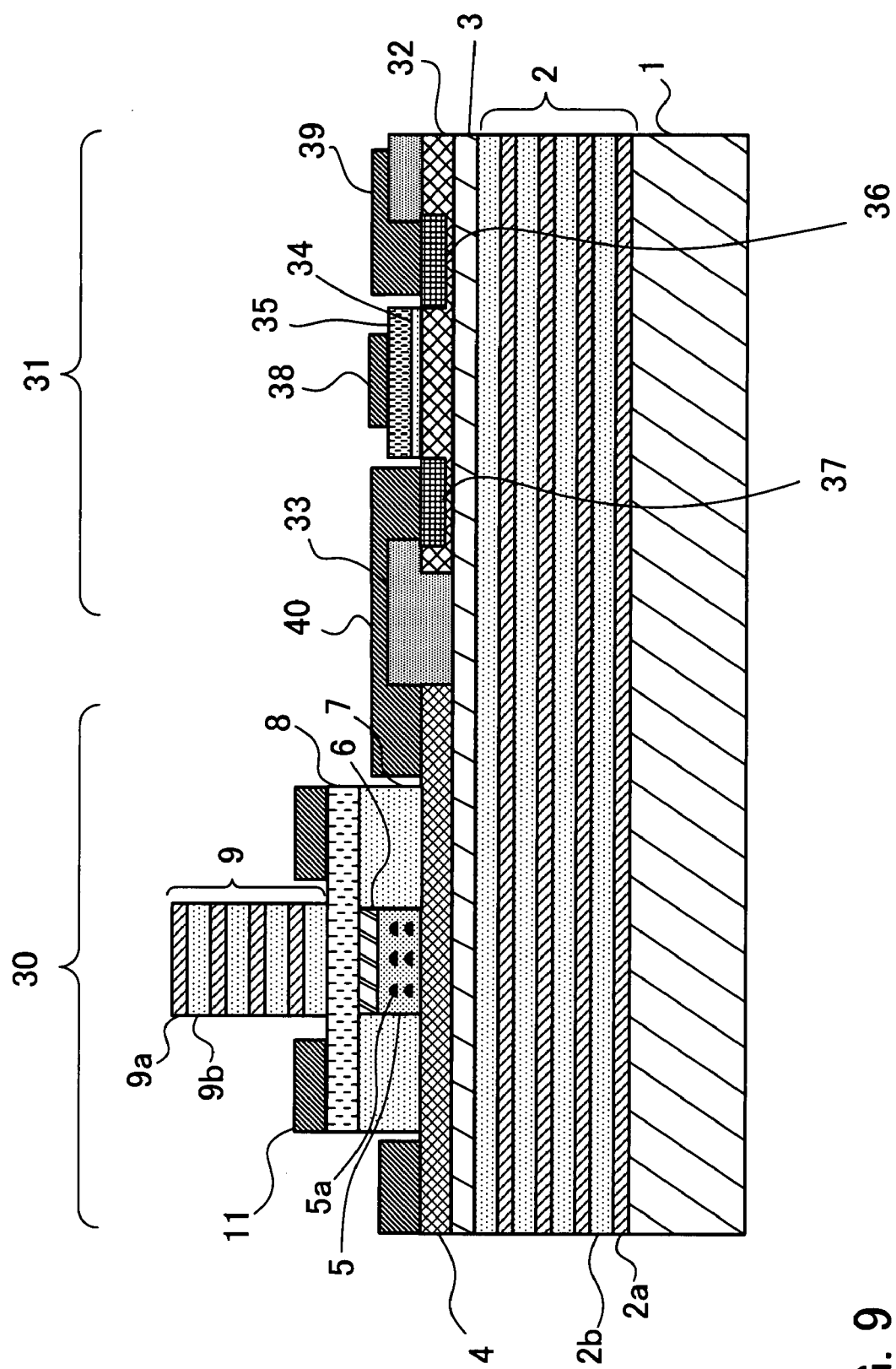
FIG. 9 is a cross sectional view showing a structure of a semiconductor laser device according to a third embodiment.

FIG. 9 is a cross sectional view showing a structure of the semiconductor laser device according to the third embodiment.

In FIG. 9, the same elements as those of the semiconductor laser device according to the first embodiment are indicated by the same reference numerals as those of the semiconductor laser device according to the first embodiment and the description is omitted.

The semiconductor laser device of the third embodiment comprises a modulation circuit using a MOSFET (Metal-Oxide-Semiconductor Field-Effect Transistor) over the same substrate as that of the semiconductor laser device of the first embodiment.

The semiconductor laser device of the third embodiment has a surface-emitting laser forming section 30 and a modulation circuit forming section 31. In the modulation circuit forming section 31, a Si layer 32 having a conductivity-type (e.g., p-type) opposite to that of the conductive layer 4 of the surface-emitting laser forming section 30 is formed over the single crystal Si layer 3 over the DBR mirror 2. Further, the Si layer 32 is separated from the conductive layer 4 by an insulating film 33. Thus, interference between the surface-emitting laser forming section 30 and the modulation circuit forming section 31 is prevented.

Over the Si layer 32, a gate oxide film ($SiO_2$ film) 34 and a polysilicon gate 35 are formed. In the Si layer 32, $n^+$ regions 36 and 37 serving as a source region and a drain region are formed by ion implantation. Further, a gate electrode 38 is formed over the polysilicon gate 35 and a source/drain electrode 39 is formed over the $n^+$ region 36. Over the $n^+$ region 37, an electrode 40 for electrically connecting the region 37 to the n-type conductive layer 4 of the surface-emitting laser forming section 30 is formed.

Thus, in the semiconductor laser device of the third embodiment, the conductive layer 4 of the surface-emitting laser forming section 30 and the $n^+$ region 37 of the MOSFET are connected by the electrode 40. Therefore, by changing a gate voltage to turn on or turn off the MOSFET, modulation of a laser beam output from the surface-emitting laser forming section 30 can be performed over the same Si substrate 1.

FIGS. 10A and 10B and FIGS. 11A and 11B show an outline of the manufacturing step of the semiconductor laser device according to the third embodiment.

In the manufacture of the semiconductor laser device of the third embodiment, formation of the MOSFET is first performed in the modulation circuit forming section 31. The reason is as follows. That is, when the surface-emitting laser is first formed, also the luminescent layer 5 portion reaches a high temperature in annealing for ion activation during formation of the $n^+$ regions 36 and 37 and as a result, defects may occur in the luminescent layer 5.

Figure 10A:
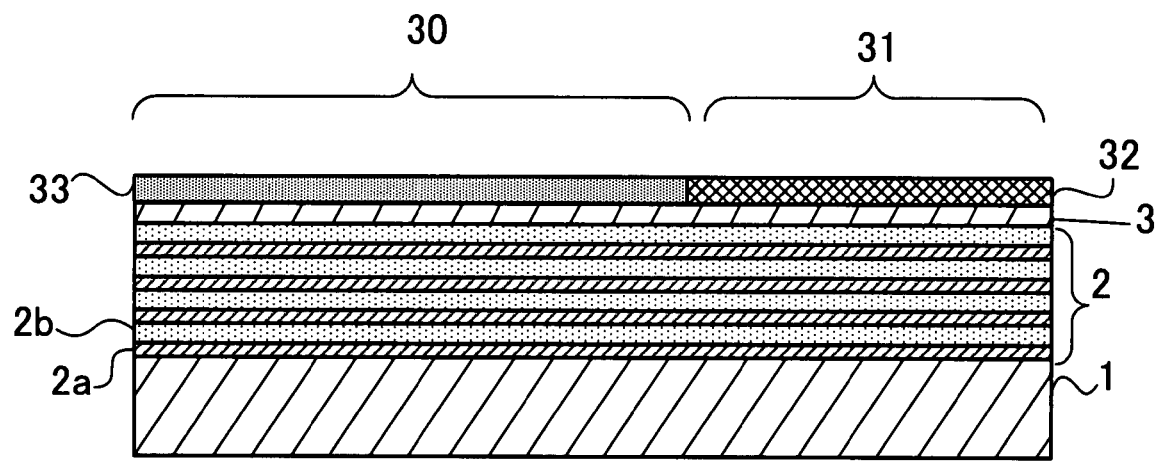
FIGS. 10A and 10B show an outline of the manufacturing step of the semiconductor laser device according to the third embodiment (part 1).

The insulating film 33 is formed over the single crystal Si layer 3 of the surface-emitting laser forming section 30, and the p-type Si layer 32 is grown over the single crystal Si layer 3 of the modulation circuit forming section 31 (FIG. 10A).

Figure 10B:
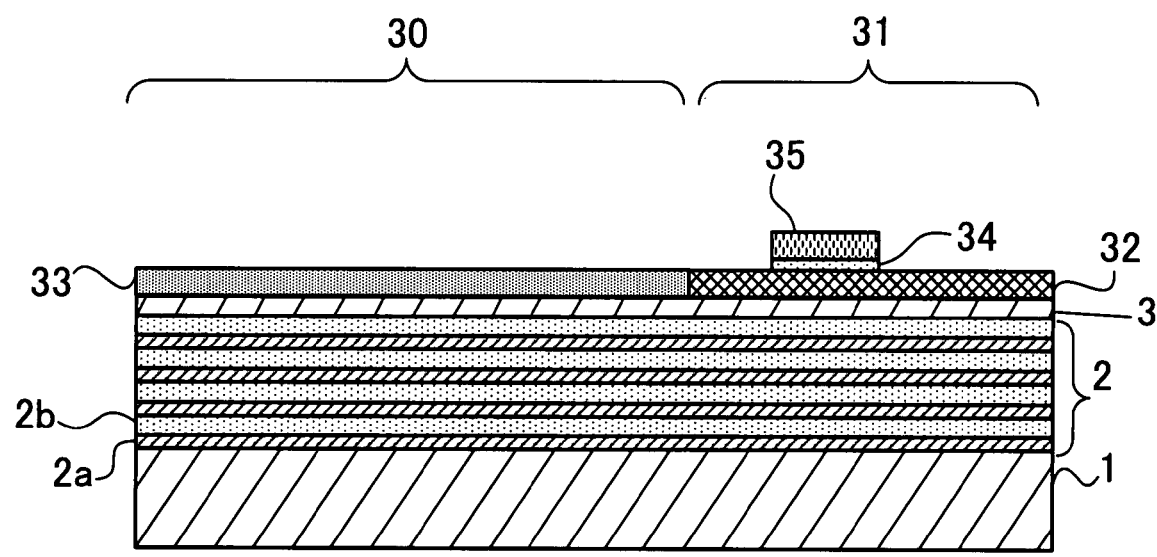
Figure 11A:
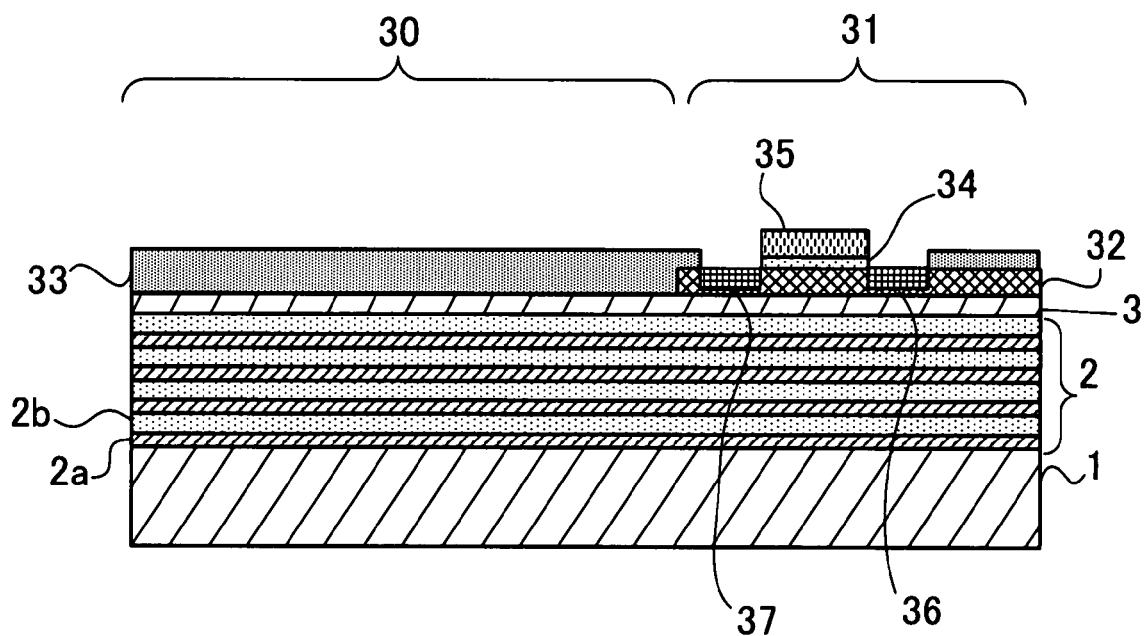
FIGS. 11A and 11B show an outline of the manufacturing step of the semiconductor laser device according to the third embodiment (part 2).
Figure 11B:
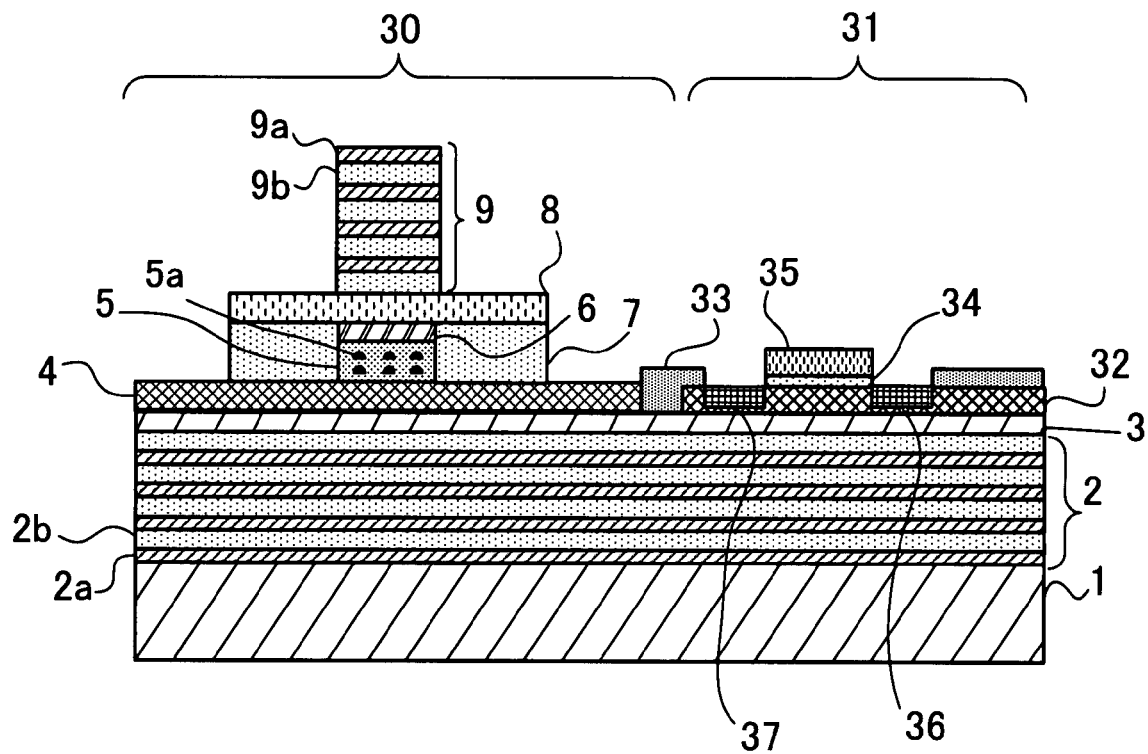

Successively, the gate insulating film 34 and the polysilicon gate 35 are patterned using lithography and etching (FIG. 10B). Next, for formation of the source region and the drain region, the insulating film 33 is made bulky and at the same time, the source region and the drain region are patterned. Further, from an opening of the insulating film 33, for example, arsenic (As) as n-type impurities is implanted at a concentration of $1 \times 10^{21}$ cm$^{-3}$ to form the $n^+$ regions 36 and 37 (FIG. 11A). Thereafter, the insulating film 33 of the surface-emitting laser forming section 30 is removed to form the surface-emitting laser according to steps shown in FIGS. 4A and 4B to FIGS. 6A and 6B (FIG. 11B). The electrode formation is, for example, finally performed. Here, the electrode over the conductive layer 4 of the surface-emitting laser forming section 30 and the electrode of the $n^+$ region 37 of the modulation circuit forming section 31 are formed as the common electrode 40. Thus, the semiconductor laser device according to the third embodiment as shown in FIG. 9 is formed.

Also in the above-described semiconductor laser device according to the third embodiment, the same effect as that of the semiconductor laser device according to the first embodiment can be obtained. At the same time, by means of the modulation circuit using the MOSFET, modulation of a laser beam can be performed over the same Si substrate 1.

In the above-described semiconductor laser device according to the third embodiment, the conductivity-type may of course be reversed.

The surface-emitting semiconductor laser device of the present invention comprises a semiconductor substrate, a first reflective layer composed of a multilayer film formed over the semiconductor substrate, a first conductive layer of a first conductivity-type formed over the first reflective layer, a luminescent layer formed over a part of the first conductive layer, an insulating layer formed over a side surface of the luminescent layer over the first conductive layer, a second conductive layer of a second conductivity-type formed over the insulating layer and the luminescent layer, a second reflective layer composed of a multilayer film formed over the second conductive layer so as to be located immediately above the luminescent layer, a first electrode electrically connected to the first conductive layer, and a second electrode formed over the second conductive layer. Therefore, even if the second reflective layer is nonconductive, a current can be injected into the luminescent layer from the second electrode formed over the second conductive layer, with no need to increase the area of the luminescent layer itself.

In other words, the top surface area of the luminescent layer can be made approximately equal to the cavity area and therefore, efficient current injection is enabled so that laser oscillation can be realized with a low current.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A surface-emitting semiconductor laser device, comprising:
    a semiconductor substrate;
    a first reflective layer composed of a multilayer film formed over the semiconductor substrate;
    a first conductive layer of a first conductivity-type formed over the first reflective layer;
    a luminescent layer formed over a part of the first conductive layer;
    an insulating layer formed over a side surface of the luminescent layer over the first conductive layer;
    a second conductive layer of a second conductivity-type with a polycrystal formed over the insulating layer and the luminescent layer;
    a second reflective layer composed of a multilayer film formed over the second conductive layer so as to be located immediately above the luminescent layer;
    a first electrode electrically connected to the first conductive layer; and
    a second electrode formed over the second conductive layer;
    wherein the second conductive layer is one of a second conductive-type silicon layer and a second conductivity-type silicon compound.

2. The semiconductor laser device according to claim 1, wherein the first conductive layer is a single crystal layer.

3. The semiconductor laser device according to claim 1, wherein the luminescent layer has a silicon germanium carbon ($Si_{1-x-y}Ge_xC_y$ ($0<x\leq1$, $0\leq y\leq0.005$)) layer including quantum dots of III-V compounds.

4. The semiconductor laser device according to claim 1, further comprising a second conductivity-type single crystal layer between the luminescent layer and the second conductive layer.

5. The semiconductor laser device according to claim 1, wherein the first reflective layer and the second reflective layer are composed of the multilayer film having an insulating film.

6. The semiconductor laser device according to claim 1, wherein:
    the semiconductor substrate and the first reflective layer are of a first conductivity-type; and
    the first electrode is disposed over a bottom surface of the semiconductor substrate.

7. The semiconductor laser device according to claim 6, wherein the first reflective layer is composed of the multilayer film including a first conductivity-type silicon germanium layer and a first conductivity-type silicon layer.

8. The semiconductor laser device according to claim 1, further comprising over the semiconductor substrate a modulation circuit using a MOSFET in which one of a first conductivity-type source region and drain region is electrically connected to the first conductive layer.

9. A method of manufacturing a surface-emitting semiconductor laser device, comprising:
    forming a first reflective layer composed of a multilayer film over a semiconductor substrate;
    forming a first conductive layer of a first conductivity-type over the first reflective layer;
    forming a luminescent layer over a part of the first conductive layer;
    forming an insulating layer over a side surface of the luminescent layer over the first conductive layer;
    forming a second conductive layer of a second conductivity-type with a polycrystal over the insulating layer and the luminescent layer;
    forming a second reflective layer composed of a multilayer film over the second conductive layer so as to be located immediately above the luminescent layer;
    forming a first electrode electrically connected to the first conductive layer; and
    forming a second electrode over the second conductive layer;
    wherein the second conductive layer is one of a second conductivity-type silicon layer and a second conductivity-type silicon compound layer.

10. The method according to claim 9, wherein:
    the first conductive layer is a single crystal layer; and
    the luminescent layer is formed over the first conductive layer by crystal growth.

11. The method according to claim 9, wherein the luminescent layer has a silicon germanium carbon ($Si_{1-x-y}Ge_xC_y$ ($0<x\leq1$, $0\leq y\leq0.005$)) layer including quantum dots of III-V compounds.

12. The method according to claim 9, further comprising the step of forming a second conductivity-type single crystal layer between the luminescent layer and the second conductive layer.

13. The method according to claim 9, wherein the first reflective layer and the second reflective layer are composed of the multilayer film having an insulating film.

14. The method according to claim 9, wherein:
    the semiconductor substrate and the first reflective layer are of a first conductivity-type; and
    the first electrode is formed over a bottom surface of the semiconductor substrate.

15. The method according to claim 14, wherein the first reflective layer, the first conductive layer and the luminescent layer are sequentially formed over the semiconductor substrate by crystal growth.

16. The method according to claim 14, wherein the first reflective layer is composed of the multilayer film including a first conductivity-type silicon germanium layer and a first conductivity-type silicon layer.

17. The method according to claim 9, further comprising the steps of forming over the semiconductor substrate a modulation circuit using a MOSFET in which one of a first conductive source region and drain region is electrically connected to the first conductive layer.

\* \* \* \* \*